(12) United States Patent
Jennings

(10) Patent No.: US 7,078,651 B2
(45) Date of Patent: Jul. 18, 2006

(54) THERMAL FLUX DEPOSITION BY SCANNING

(75) Inventor: Dean Jennings, Melrose, MA (US)

(73) Assignee: Applied Materials Inc., Santa Clara, CA (US)

(*) Notice: Subject to any disclaimer, the term of this patent is extended or adjusted under 35 U.S.C. 154(b) by 177 days.

(21) Appl. No.: 10/202,119

(22) Filed: Jul. 23, 2002

(65) Prior Publication Data

US 2003/0196993 A1 Oct. 23, 2003

Related U.S. Application Data

(63) Continuation-in-part of application No. 10/126,419, filed on Apr. 18, 2002.

(51) Int. Cl.
B23K 26/08 (2006.01)

(52) U.S. Cl. .................. 219/121.8; 219/121.78
(58) Field of Classification Search .............. 219/121.8, 219/121.78, 121.79, 121.81, 121.82, 121.83
See application file for complete search history.

(56) References Cited

U.S. PATENT DOCUMENTS

| | | | |
|---|---|---|---|
| 3,720,784 A | 3/1973 | Maydan et al. | |
| RE28,375 E | 3/1975 | Maydan et al. | |
| 4,151,008 A | 4/1979 | Kirkpatrick | 148/1.5 |
| 4,520,472 A | 5/1985 | Reno | |
| 5,269,847 A | 12/1993 | Anderson et al. | |
| 5,357,365 A | 10/1994 | Ipposhi et al.jf124c | |

FOREIGN PATENT DOCUMENTS

| | | | |
|---|---|---|---|
| DE | 4234342 A | * | 10/1992 |
| DE | 4232342 | | 4/1994 |
| DE | 836905 A | * | 10/1996 |
| DE | 836905 A | * | 4/1998 |
| EP | 836905 | | 4/1998 |
| JP | 09040499 A | * | 7/1995 |
| JP | 409040500 A | * | 7/1995 |
| JP | 02000323428 A | * | 2/2000 |
| WO | WO 01/73769 A1 | | 10/2001 |

OTHER PUBLICATIONS

Meyerson et al., "Experimental and Chemical Kinetic Modelling Study of Silicon CVD from Monosilane and Disilane", *CHEMTRONICS*, 1986, vol. 1, Dec., pp. 150–155.

"Vortek Impulse™ Anneal", http://www.vortek.com/semi/htm, last visited Apr. 4, 2002.

Primary Examiner—M. Alexandra Elve
(74) Attorney, Agent, or Firm—Charles S. Guezner LLP

(57) ABSTRACT

A substrate is initially positioned in the reaction chamber. One or more gases are introduced into the reaction chamber. A predetermined speed for translating a line of radiation is determined. Continuous wave electromagnetic radiation is then emitted from a continuous wave radiation source. The continuous wave electromagnetic radiation is subsequently focused into a line of radiation extending across the surface of the substrate. The line of radiation is then translated relative to the surface at the constant predetermined speed. The combination of the introduced gas/es and heat generated by the line of radiation causes the gas/es to react and deposit a layer on the surface of the substrate. Undesirable byproducts of the reaction are then flushed from the reaction chamber. This process is repeated until a layer having a predetermined thickness is formed on the surface of the substrate.

62 Claims, 9 Drawing Sheets

U.S. PATENT DOCUMENTS

| | | | |
|---|---|---|---|
| 5,463,534 A | 10/1995 | Raven | 362/32 |
| 5,508,067 A | 4/1996 | Sato et al. | |
| 5,529,630 A | 6/1996 | Imahashi et al. | 118/665 |
| 5,660,472 A | 8/1997 | Peuse et al. | |
| 5,782,980 A | 7/1998 | Allen et al. | |
| 5,986,234 A | 11/1999 | Matthews et al. | |
| 6,019,839 A * | 2/2000 | Achutharaman et al. | 117/88 |
| 6,080,965 A | 6/2000 | Osawa | |
| 6,103,014 A | 8/2000 | Lei et al. | |
| 6,204,483 B1 | 3/2001 | Fair et al. | |
| 6,215,106 B1 * | 4/2001 | Boas et al. | 219/390 |
| 6,242,292 B1 * | 6/2001 | Yamazaki et al. | 438/166 |
| 6,326,248 B1 * | 12/2001 | Ohtani et al. | 438/151 |
| 6,337,467 B1 * | 1/2002 | Sik | 219/411 |
| 6,376,806 B1 | 4/2002 | Yoo | 219/411 |
| 6,393,042 B1 | 5/2002 | Tanaka | 372/101 |
| 6,514,339 B1 | 2/2003 | Jung | 117/107 |
| 6,531,681 B1 | 3/2003 | Markle et al. | 219/121.8 |
| 6,567,219 B1 | 5/2003 | Tanaka | 359/624 |

\* cited by examiner

THERMAL FLUX DEPOSITION BY SCANNING

This application claims priority to, and is a continuation-in-part of, U.S. patent application entitled "THERMAL FLUX PROCESSING BY SCANNING," having Ser. No. 10/126,419, and filed on Apr. 18, 2002, which is hereby incorporated by reference.

BACKGROUND OF THE INVENTION

1. Field of the Invention

The invention relates generally to semiconductor device manufacture. More particularly, the invention is directed to an apparatus and method for depositing one or more layers on a substrate using a line of electromagnetic radiation. Furthermore, the invention is directed to an apparatus and method for thermally processing a substrate by scanning the substrate with a line of radiation.

2. Description of Related Art

The integrated circuit (IC) market is continually demanding greater memory capacity, faster switching speeds, and smaller feature sizes. One of the major steps the industry has taken to address these demands is to change from batch processing a substrate, such as silicon wafers, in large furnaces to single substrate processing in small reaction chambers.

Generally, there are four basic operations performed in such batch processing fabrication, namely layering, patterning, doping, and heat treatments. Many of these operations require heating the substrate to high temperatures so that various chemical and physical reactions can take place. Of particular interest, are heat treatments and layering, each of which will be discussed below.

Heat treatments are operations in which the substrate is simply heated and cooled to achieve specific results. During heat treatment no additional material is added to or removed from the substrate. Heat treatments typically require providing a relatively large amount of thermal energy to the substrate in a short of amount of time, and thereafter rapidly cooling the substrate to terminate the thermal process. The thermal budget of a material is the diffusivity, a function of temperature, which is integrated over time. The amount of thermal energy transferred to the substrate during processing is known as the thermal budget. The thermal budget is proportional to temperature duration of the process. A low thermal budget is desired in ultra-small IC manufacturing, which can only be provided at high temperature if the time of the process is very short.

Examples of heat treatments currently in use include Rapid Thermal Processing (RTP) and impulse (spike) annealing. While such processes are widely used, current technology is not ideal. It tends to ramp the temperature of the substrate too slowly and expose the substrate to elevated temperatures for too long. These problems become more severe with increasing substrate sizes, increasing switching speeds, and/or decreasing feature sizes.

In general, these heat treatments raise the substrate temperature under controlled conditions according to a predetermined thermal recipe. These thermal recipes fundamentally consist of: a temperature that the substrate must be heated to; the rate of change of temperature, i.e., the temperature ramp-up and ramp-down rates; and the time that the thermal processing system remains at a particular temperature. For example, thermal recipes may require the substrate to be heated from room temperature to distinct temperatures of 1200° C. or more, for processing times at each distinct temperature ranging up to 60 seconds, or more.

Moreover, to meet certain objectives, such as minimal diffusion, the amount of time that each substrate is subjected to high temperatures must be restricted. To accomplish this, the temperature ramp rates, both up and down, are preferably high. In other words, it is desirable to be able to adjust the temperature of the substrate from a low to a high temperature, or visa versa, in as short a time as possible, i.e., have a low thermal budget.

The requirement for high temperature ramp rates led to the development of Rapid Thermal Processing (RTP), where typical temperature ramp-up rates range from 200 to 400° C./s, as compared to 5–15° C./minute for conventional furnaces. Typical ramp-down rates are in the range of 80–150° C./s.

FIG. 1 is a graph 100 of thermal profiles of different prior art thermal processes. As can be seen, the thermal profile 102 of a typical RTP system has a 250° C./s ramp-up rate and a 90° C./s ramp-down rate.

A drawback of RTP is that it heats the entire substrate even though the IC devices reside only in the top few microns of the substrate. This limits how fast one can heat up and cool down the substrate. Moreover, once the entire substrate is at an elevated temperature, heat can only dissipate into the surrounding space or structures. As a result, today's state of the art RTP systems struggle to achieve a 400° C./s ramp-up rate and a 150° C./s ramp-down rate.

FIG. 1 also shows a thermal profile 104 of a laser annealing process. Laser annealing is used during the fabrication of Thin Film Transistor (TFT) panels. Such systems use a laser spot to melt and recrystalize polysilicon. The entire TFT panel is exposed by scanning the laser spot across successive exposure fields on the panel. For substrate applications a laser pulse is used to illuminate an exposure field for a duration of approximately 20–40 ns, where the exposure field is typically about 25 by 35 mm. As can be seen from the thermal profile 104 for laser annealing, the ramp rate is nearly instantaneous at billions of degrees per second. However, the laser pulse or flash used for laser annealing is too fast and, often does not provide enough time for sufficient annealing to occur for non-melt processes. Also, devices or structures next to the exposed regions may be exposed to extreme temperatures causing them to melt, or to temperatures that are too low resulting in too little annealing. Still further, homogenization of the thermal exposure of each portion of the substrate is difficult to attain because different regions adsorb at different rates resulting in huge temperature gradients. The process is too fast for thermal diffusion to equilibrate temperature, thereby creating severe pattern dependencies. As a result, this technology is not appropriate for single crystal silicon annealing because different regions on the substrate surface may be heated to vastly different temperatures causing large non-uniformities over short distances.

Another thermal processing system currently in development by Vortek Industries Ltd., of Canada, uses flash assisted spike annealing to attempt to provide a high thermal energy to the substrate in a short of amount of time and then rapidly cool the region to limit the thermal exposure. Use of this thermal processing system should give the junction depth of a spike anneal to 1060° C. but improve the activation with flash to 1100° C. Typically, the RTP system ramps up to the desired temperature typically around 1060° C. then begins to ramp down immediately after having reached the desired flash temperature. This is done to minimize the amount of diffusion that takes place while still getting suitable activation from the elevated temperature. The thermal profile 106 of such a flash assisted spike anneal is also shown in FIG. 1.

In view of the above, there is a need for an apparatus and method for annealing a substrate with high ramp-up and ramp-down rates. This will offer greater control over the fabrication of smaller devices leading to increased performance. Furthermore, such an apparatus and method should ensure that every point of the substrate has a substantially homogenous thermal exposure, thereby reducing pattern dependencies and potential defects.

Turning our attention to layering, which is another basic fabrication operation that typically requires the addition of energy or heat. Deposition adds thin layers or films to a substrate's surface. Layers are added to the surface by two major techniques, growing and deposition. The added layers function in the IC devices as semiconductors, dielectrics (insulators), or conductors. These layers must meet general and specific parameters, such as uniform thickness, smooth and flat surfaces, uniform composition and grain size, stress-free films, purity, and integrity. Common deposition techniques that require the addition of energy are: Chemical Vapor Deposition (CVD); a variation of CVD known as Rapid Thermal Chemical Vapor Deposition (RTCVD); another variation of CVD known as Low Pressure CVD (LPCVD); and Atomic Layer Deposition (ALD).

CVD is the most widely used technique for physically depositing one or more layers or films, such as silicon nitride ($Si_3N_4$), on a substrate surface. During the CVD process, various gases, such as ammonia ($NH_3$) and dichlorosilane (DCS), containing the atoms or molecules required in the final film are injected into a reaction chamber. Chemical reactions between the gases are induced with high energy such as heat, light, or plasma. The reacted atoms or molecules deposit on the substrate surface and build up to form a thin film having a predetermined thickness. By products of the reactions are subsequently flushed from the reaction chamber. The deposition rate can be manipulated by controlling the reaction condition of supplied energy; the amount and ratio of gases present in the reaction chamber; and/or the pressure within the reaction chamber.

The reaction energy is typically supplied by heat (either conduction or convection), induction RF, radiant, plasma, or ultraviolet energy sources. Temperatures typically range from room temperature to 1250° C., and more typically from 250° C. to 850° C.

In CVD and LPCVD, the various gases are supplied or injected into the reaction chamber at the same time. A gas phase reaction occurring between the reactant gases may, however, occur at any location within the reaction chamber, including the ambient space around the substrate. Reactions occurring in the ambient space are undesirable as they tend to form small particles of the desired material which do not adhere well to the surface of the substrate. This may result in a non-uniform layer or a layer with numerous defects.

Although, it is desirable in current thermally driven processes to heat the substrate to a high temperature, it is also desirable that the substrate is not exposed to these high temperatures for too long. In other words, it is desirable to be able to adjust the temperature of the substrate from a low to a high temperature, or visa versa, in as short a time as possible, i.e., have a low thermal budget.

However, current thermally driven processes heat the entire substrate, despite the fact that only the surface of the substrate needs to be heated. Heating the entire substrate limits how fast one can heat up and cool down the substrate, as the substrate has a thermal inertia that resists changes in temperature. For example, once the entire substrate is at an elevated temperature, cooling the substrate can only occur by heat dissipating into the surrounding space or structures.

More recently, ALD was developed to address the above described gas phase reaction problems with CVD and LPCVD. In ALD, a first gas is injected into the reaction chamber. The atoms or molecules of the first gas adhere to the surface of the substrate. A purging gas is then injected to flush the first gas from the reaction chamber. Finally, a second gas is injected into the reaction chamber to react with the first gas on the surface of the substrate. As the first and second gases are not present in the reaction chamber at the same time, gas phase reaction does not occur in the ambient space. This eliminates the problems associated with particle formation in the ambient space. However, deposition rates for ALD are slow, taking approximately 1 Angstrom per second. Also, ALD is bound by the same temperature constraints and thermal budget issues as CVD.

In light of the above, there is a need for an apparatus and method for depositing layers on a substrate that reduces gas phase reaction problems. More specifically, such an apparatus and method, should only heat the surface of the substrate and provide high ramp-up and ramp-down rates, i.e., low thermal budget. Such an apparatus and method preferably meets general and specific parameters, such as uniform layer thickness, smooth and flat layer surfaces, uniform layer composition and grain size, low stress films, purity, and integrity.

BRIEF SUMMARY OF THE INVENTION

According to the invention there is provided an apparatus for depositing layers on a substrate. The apparatus includes a reaction chamber and a gas injector configured to inject at least one gas into the reaction chamber. The apparatus also includes a continuous wave electromagnetic radiation source, a stage within the reaction chamber, and optics disposed between the continuous wave electromagnetic radiation source and the stage. The stage is configured to receive a substrate thereon. The optics are configured to focus continuous wave electromagnetic radiation from the continuous wave electromagnetic radiation source into a line of continuous wave electromagnetic radiation on an upper surface of the substrate. A length of the line of continuous wave electromagnetic radiation extends across the substrate. The apparatus further includes a translation mechanism configured to translate the stage and the line of continuous wave electromagnetic radiation relative to one another.

Further according to the invention there is provided a method for depositing one or more layers on a substrate. The substrate is initially positioned in the reaction chamber. One or more gases are introduced into the reaction chamber. A predetermined speed for translating a line of radiation is determined. This predetermined speed is based on a number of factors, such as a thermal recipe for processing the substrate, the properties of the substrate, a power of the continuous wave electromagnetic radiation, a width of the line of radiation, a power density at the line of radiation, or the like.

Continuous wave electromagnetic radiation is then emitted from a continuous wave radiation source and preferably collimated. The continuous wave electromagnetic radiation is subsequently focused into a line of radiation extending across the surface of the substrate. The line of radiation is then translated relative to the surface at the constant predetermined speed.

The combination of the introduced gas/es and heat generated by the line of radiation causes at least one gas to react and deposit a layer on the surface of the substrate. Undesirable byproducts of the reaction are then flushed from the reaction chamber. This process is repeated until a layer having a predetermined thickness is formed on the surface of the substrate.

According to yet another embodiment of the invention there is provided a thermal flux processing device. The thermal flux processing device includes a continuous wave electromagnetic radiation source, a stage, optics, and a translation mechanism. The continuous wave electromagnetic radiation source is preferably one or more laser diodes. The stage is configured to receive a substrate thereon. The optics are preferably disposed between the continuous wave electromagnetic radiation source and the stage and are configured to focus continuous wave electromagnetic radiation from the continuous wave electromagnetic radiation source into a line of continuous wave electromagnetic radiation on an upper surface of the substrate. A length of the line of continuous wave electromagnetic radiation preferably extends across an entire width of the substrate. The translation mechanism is configured to translate the stage and the line of continuous wave electromagnetic radiation relative to one another, and preferably includes a chuck for securely grasping the substrate.

Still further, there is provided a method for thermally processing a substrate. A continuous wave of radiation is focused into a line of radiation at an upper surface of the substrate. The line of radiation is translated relative to the surface at a constant predetermined speed. This allows for every point of the substrate to have a substantially homogenous thermal exposure or history. Process control is achieved by modulating scan speed rather than lamp power, thereby simplifying the control of the apparatus. This allows for highly local heating without generating defects.

Therefore, the present invention heats only a small portion of the surface of the substrate at any given moment. This reduces the total radiated power requirement. In fact, an energy density of 150 kW/cm$^2$ is achievable on a 300 mm substrate from a 5 kW radiation source.

By heating a small area at any given moment, it is possible to achieve millions of degrees per second ramp rates on a substrate with only a few kilowatts of radiated power. Additionally, ramp rates this high allow for the upper surface to be heated from ambient temperature to 1200° C. or higher and cooled back down to nearly ambient temperature before the bulk substrate temperature can rise.

The above described apparatus and method can heat the substrate surface to any temperature for a millisecond or less. In addition, as the line of radiation only applies heat to the surface of the substrate, the reaction of the gasses only occurs at the surface. This allows, multiple gasses to be injected simultaneously without leading to undesirable gas phase reactions away from the substrate surface. This method can be performed at atmospheric pressure, resulting in faster decomposition of reactants, thereby enabling high deposition rates.

BRIEF DESCRIPTION OF THE DRAWINGS

For a better understanding of the nature and objects of the invention, reference should be made to the following detailed description, taken in conjunction with the accompanying drawings, in which.

Figure 1:
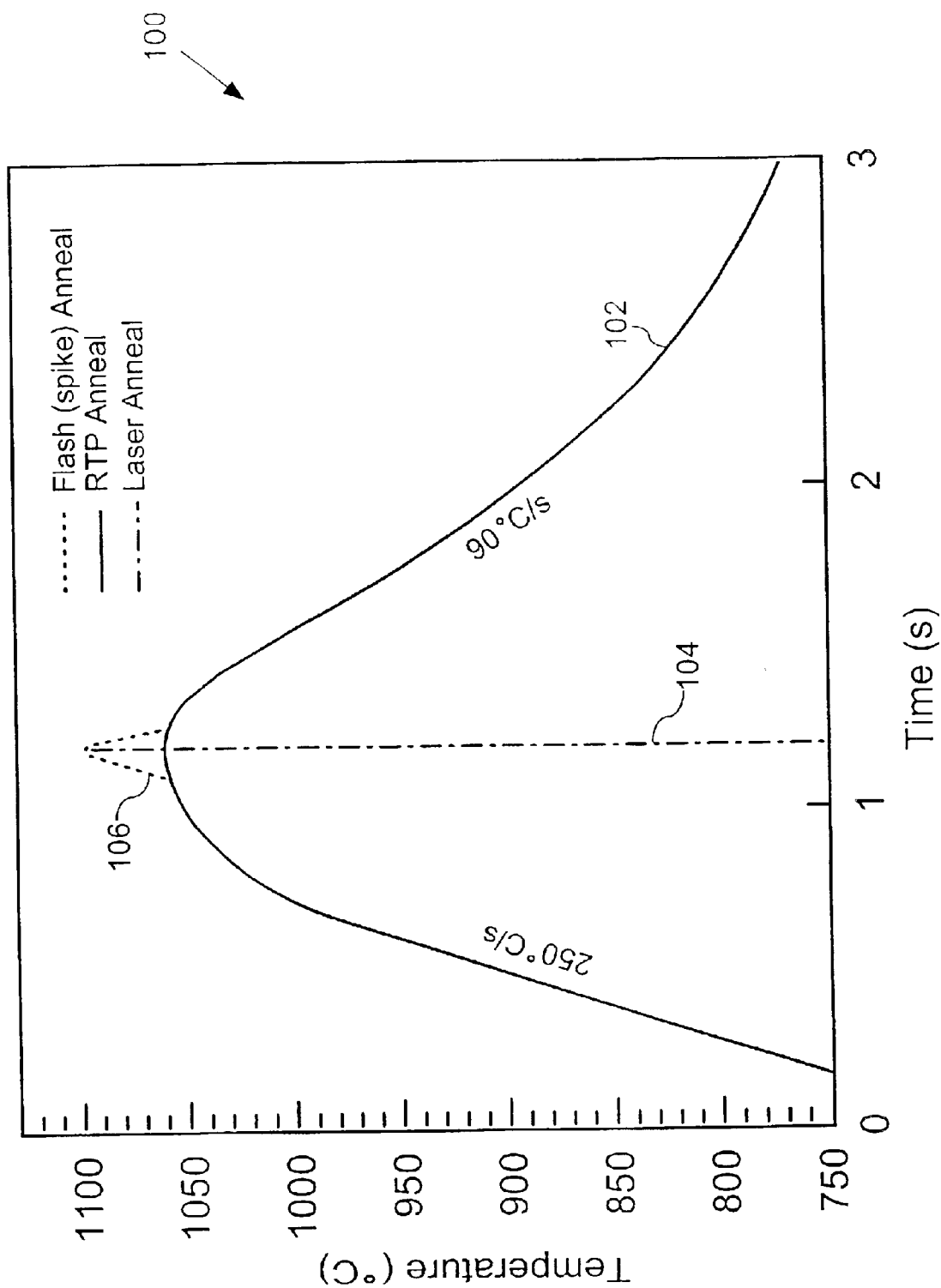
FIG. 1 is a graph of thermal profiles of different prior art thermal processes.

Like reference numerals refer to corresponding parts throughout the several views of the drawings. For ease of reference, the first number of any reference numeral generally indicates the number of the figure where the reference numeral can be found. For example, 102 can be found on FIG. 1, and 506 can be found on FIG. 5.

DETAILED DESCRIPTION OF THE INVENTION

Figure 2A:
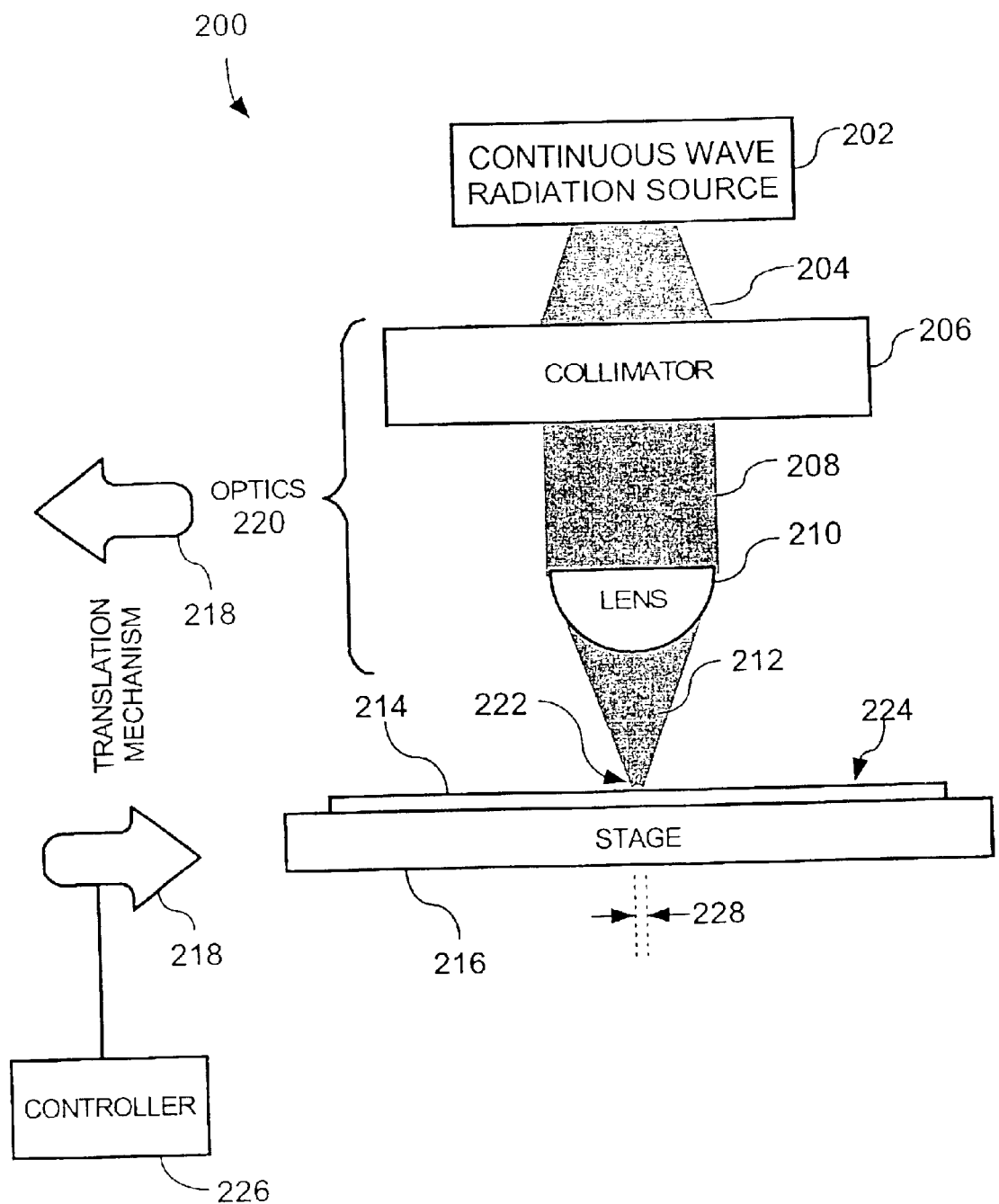
FIG. 2A is a side view of an apparatus for thermally processing a substrate, according to an embodiment of the invention.

FIG. 2A is a side view of an apparatus 200 for thermally processing a substrate, according to an embodiment of the invention. The thermal process is any thermal process that requires the characteristics of the invention described below. Exemplary embodiments of such a thermal process includes thermal annealing of substrates or thermal processes used in Chemical Vapor Deposition (CVD), both of which will be described throughout the remainder of the Figures.

The apparatus 200 comprises a continuous wave electromagnetic radiation source 202, a stage 216 configured to receive a substrate 214 thereon, and optics 220 disposed between the continuous wave electromagnetic radiation source 202 and the stage 216.

In a preferred embodiment, the substrate 214 is any suitable substrate, such as a single crystal silicon substrate; silicon on insulator (SOI); Silicon Germanium or alloys thereof; glass or quartz substrate with a silicon layer thereon, as used for manufacturing thin film transistors (TFT); or the like. It should however be appreciated that thermal flux processing of single crystal silicon substrates is more difficult than that of TFT substrates, as single crystal silicon substrates have a much higher thermal conductivity than TFTs and the single crystal silicon substrates' applications require tighter control.

The continuous wave electromagnetic radiation source 202 is capable of emitting "continuous waves" or rays of electromagnetic radiation, such as light. By "continuous wave" it is meant that the radiation source is configured to emit radiation continuously, i.e., not a burst, pulse, or flash of radiation. This is quite unlike lasers used in laser annealing, which typically use a burst or flash of light.

Furthermore, as the continuous wave electromagnetic radiation needs to be adsorbed at or near the surface of the substrate, the continuous wave electromagnetic radiation preferably has a wavelength between 190 nm and 950 nm. More preferably, it has a wavelength of 808 nm.

In a preferred embodiment, the continuous wave electromagnetic radiation source 202 is capable of emitting radiation continuously for at least 15 seconds. Also, in a preferred embodiment, the continuous wave electromagnetic radiation source 202 comprises multiple laser diodes, each of which produces uniform and spatially coherent light at the same wavelength. In yet another preferred embodiment, the power of the laser diode/s is in the range of 0.5 kW to 50 kW, but preferably approximately 5 kW. Suitable laser diodes are made by Spectra-Physics of California, or by Cutting Edge Optronics, Inc. of St. Charles Mo. One such suitable laser diode is Spectra Physics' MONSOON® multi-bar module (MBM), which provides 40–480 watts of continuous wave power per laser diode.

The optics 220 preferably comprise one or more collimators 206 to collimate radiation 204 from the continuous wave electromagnetic radiation source 202 in a direction perpendicular to an upper surface 224 of the substrate 214. This collimated radiation 208 is then focused 212 by at least one lens 210 into a line of radiation 222 at an upper surface 224 of the substrate 214.

Lens 210 is any suitable lens, or series of lenses, capable of focusing radiation into a line. In a preferred embodiment, lens 210 is a cylindrical lens. Alternatively, lens 210 may be one or more concave lenses, convex lenses, plane mirrors, concave mirrors, convex mirrors, refractive lenses, diffractive lenses, Fresnel lenses, gradient index lenses, or the like.

The stage 216 is any platform capable of securely holding the substrate 214 during translation, as explained below. In a preferred embodiment, the stage 216 includes a means for grasping the substrate, such as a frictional, gravitational, mechanical, or electrical system. Examples of suitable means for grasping include, mechanical clamps, electrostatic or vacuum chucks, or the like.

The apparatus 200 also comprises a translation mechanism 218 configured to translate the stage 216 and the line of radiation 222 relative to one another. In one embodiment, the translation mechanism 218 is coupled to the stage 216 to move the stage 216 relative to the continuous wave electromagnetic radiation source 202 and/or the optics 220. In another embodiment, the translation mechanism 218 is coupled to the continuous wave electromagnetic radiation source 202 and/or the optics 220 to move the continuous wave electromagnetic radiation source 202 and/or the optics 220 relative to the stage 216. In yet another embodiment, the translation mechanism 218 moves both the continuous wave electromagnetic radiation source 202 and/or the optics 220, and the stage 216. Any suitable translation mechanism may be used, such as a conveyor system, rack and pinion system, or the like.

The translation mechanism 218 is preferably coupled to a controller to control the scan speed at which the stage 216 and the line of radiation 222 move relative to one another. In addition, translation of the stage 216 and the line of radiation 222 relative to one another is preferably along a path perpendicular to the line of radiation 222 and parallel to the upper surface 224 of the substrate 214. In a preferred embodiment, the translation mechanism 218 moves at a constant speed. Preferably, this constant speed is approximately 2 cm/s for a 35 micron wide line. In another embodiment, the translation of the stage 216 and the line of radiation 222 relative to one another is not along a path perpendicular to the line of radiation 222.

Figure 2B:
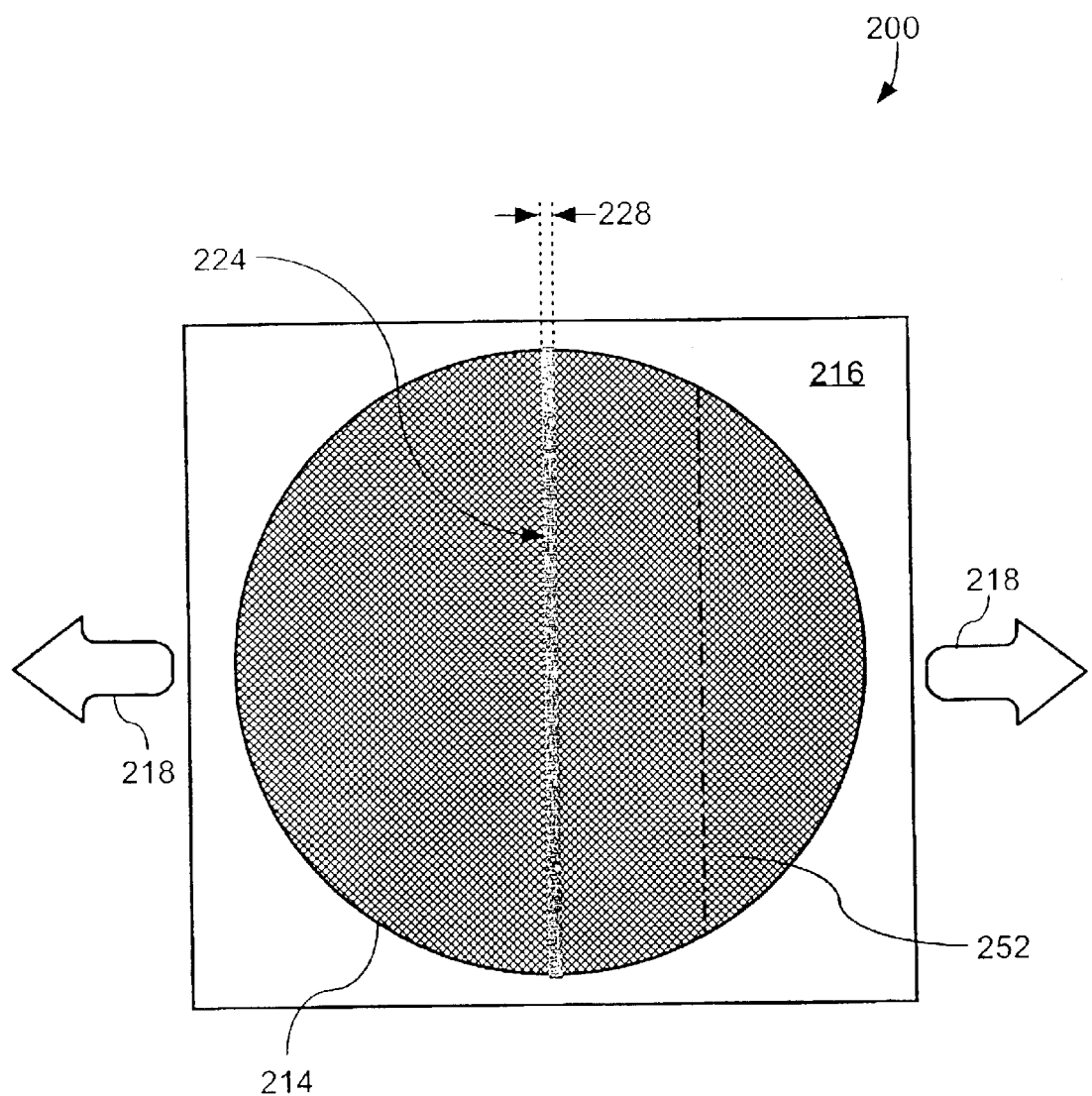
FIG. 2B is a top view of the substrate and stage shown in FIG. 2A.

FIG. 2B is a top view of the substrate and stage shown in FIG. 2A. In a preferred embodiment, the substrate 214 is a circular substrate with a diameter of 200 or 300 mm, and a thickness of approximately 750 microns. Also, in a preferred embodiment, the line of radiation 222 has a length that extends at least across the entire diameter or width of the substrate 214. The line of radiation 222 also preferably has a width 228 of between 3 and 500 microns. However, in a preferred embodiment, the line of radiation 222 has a width 228 of approximately 35 microns. The width is measured at half the maximum intensity of the radiation (otherwise knows as Full Width Half Max (FWHM)). In all embodiments, the length of the line is longer than its width. In a preferred embodiment, the line of radiation 222 linearly traverses the substrate 214, such that it remains parallel to a fixed line or chord 252 at all times.

A preferred power density at the line of radiation is between 10 kW/cm$^2$ and 200 kW/cm$^2$ with a nominal range near 60 kW/cm$^2$. It is not readily achievable to radiate the entire surface of a substrate at these power densities, but it is possible to scan across the substrate a line of radiation that has this intensity. For example, an experiment using a 400 microns wide line of radiation with a peak power density of 70 kW/cm$^2$ scanned at 100 cm/s, heated the surface of a substrate to approximately 1170° C. with ramp-up and ramp-down rates exceeding 4 million° C./s.

Figure 3:
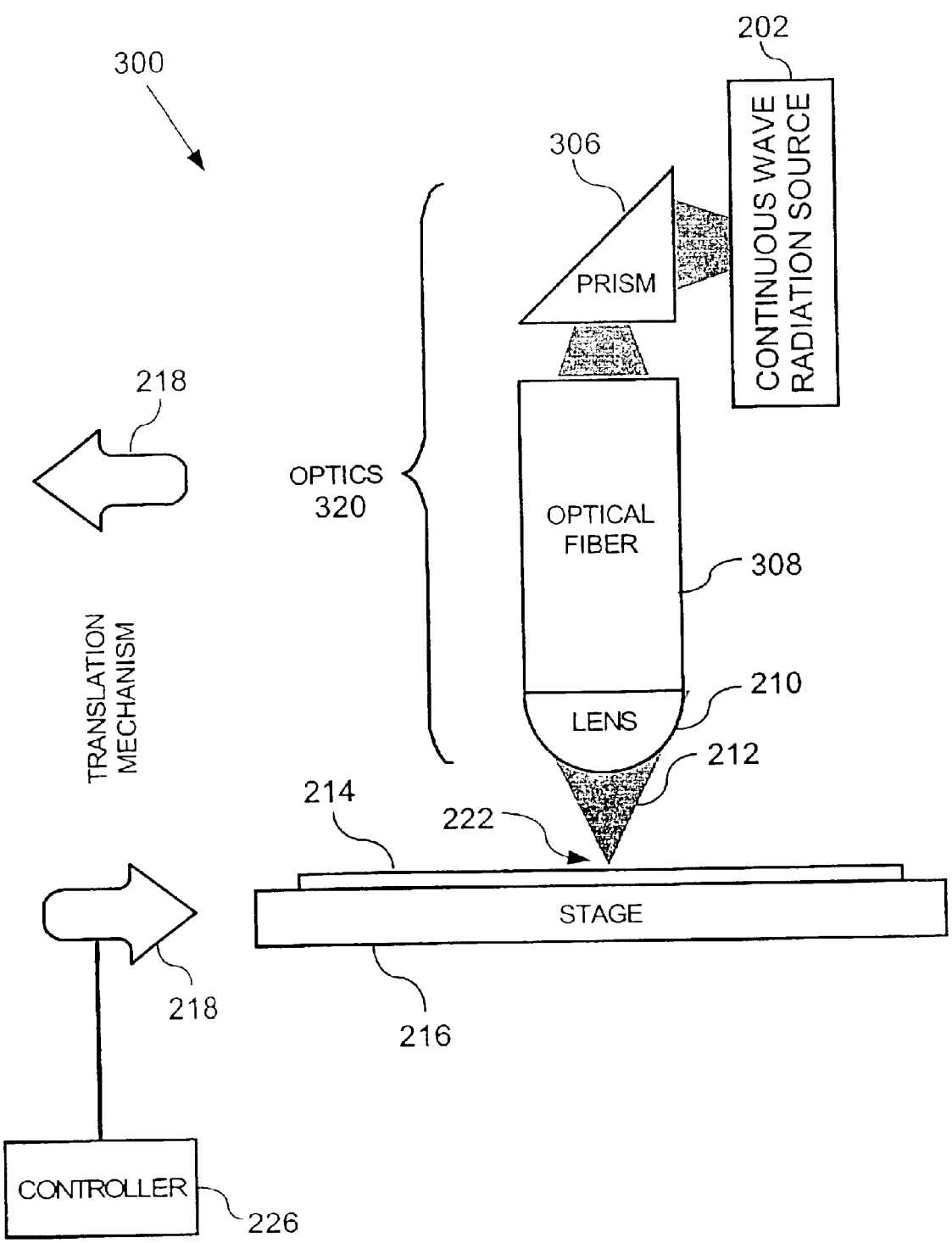
FIG. 3 is a side view of another apparatus for thermally processing a substrate, according to another embodiment of the invention.

FIG. 3 is a side view of another apparatus 300 for thermally processing a substrate, according to another embodiment of the invention. This embodiment merely shows another arrangement of optics 320. In this embodiment, the optics 320 comprise a lens 210 and one or more radiation guides, such as one or more optical fibers 308 and prism 306. Other radiation guides such as a waveguide, mirror, or diffuser may also be used.

Radiation from the continuous wave electromagnetic radiation source 202 is directed at the prism 306 which redirects the radiation towards one or more optical fibers 308. Radiation is transmitted through the optical fiber/s 308 towards the lens 210, where it is focused into a line of radiation 222.

It should be appreciated that many different combinations of the aforementioned optics 220 (FIG. 2A) or 320 may be used to transmit and focus the radiation from the continuous wave electromagnetic radiation source into a line of radiation. Also, a linear array of laser diodes could be used as the radiation source. Additionally, any suitable means for producing a uniform radiation distribution, such as a radiation diffuser, may be used.

Figure 4:
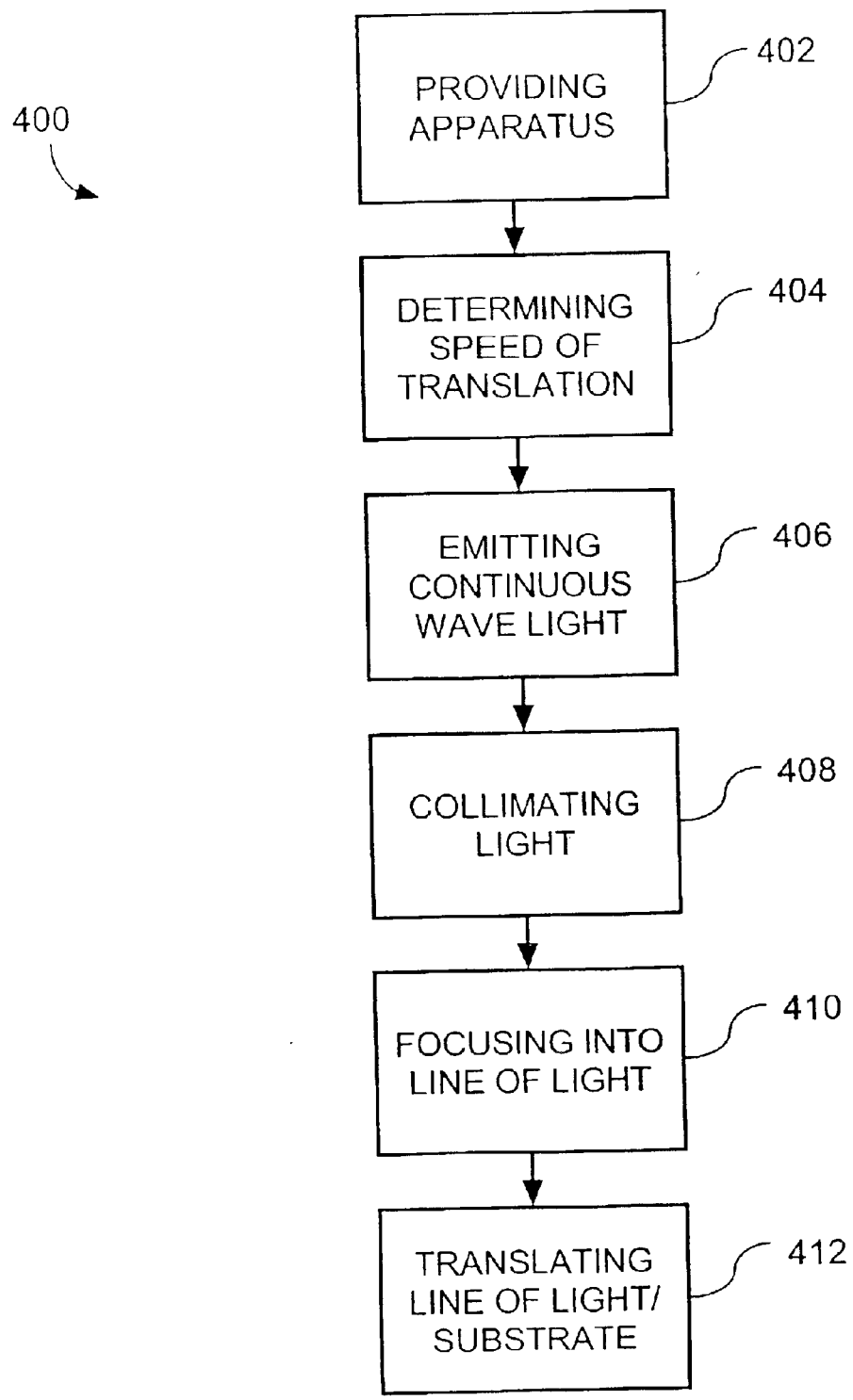
FIG. 4 is a flow chart of a method for thermally processing a substrate.

FIG. 4 is a flow chart 400 of a method for thermally processing a substrate 214 (FIG. 2A). An apparatus as described above in relation to FIGS. 2 and 3 is provided at step 402. The controller 226 (FIG. 2A) then determines, at step 404, the scan speed at which the line of radiation 222 (FIG. 2A) and the substrate will move relative to one another. This determination is based on the thermal recipe for processing the substrate; the substrate properties; the power of the continuous wave electromagnetic radiation source 202 (FIG. 2A); the width of the line of radiation; the power density at the line of radiation; etc.

The continuous wave electromagnetic radiation source 202 (FIG. 2A) emits a continuous wave of radiation 204 (FIG. 2A), at step 406. This radiation 204 is preferably collimated into a collimated beam of radiation 208 (FIG. 2A), at step 408. The collimated beam of radiation 208 (FIG. 2A) is focused into a line of radiation 222 (FIG. 2A), at step 410. In accordance with the predetermined scan speed, the stage 216 (FIG. 2A) and the line of radiation 222 (FIG. 2A) are translated, at step 412, relative to one another by the translation mechanism 218 (FIG. 2A). This translation is along a path perpendicular to the line of radiation 222 and parallel to the upper surface of the substrate, such that the line of radiation traverses the entire substrate 214. In a preferred embodiment, the translation mechanism 218 scans the radiation source and optics over the upper surface of the substrate at approximately 2 cm/s.

Figure 5:
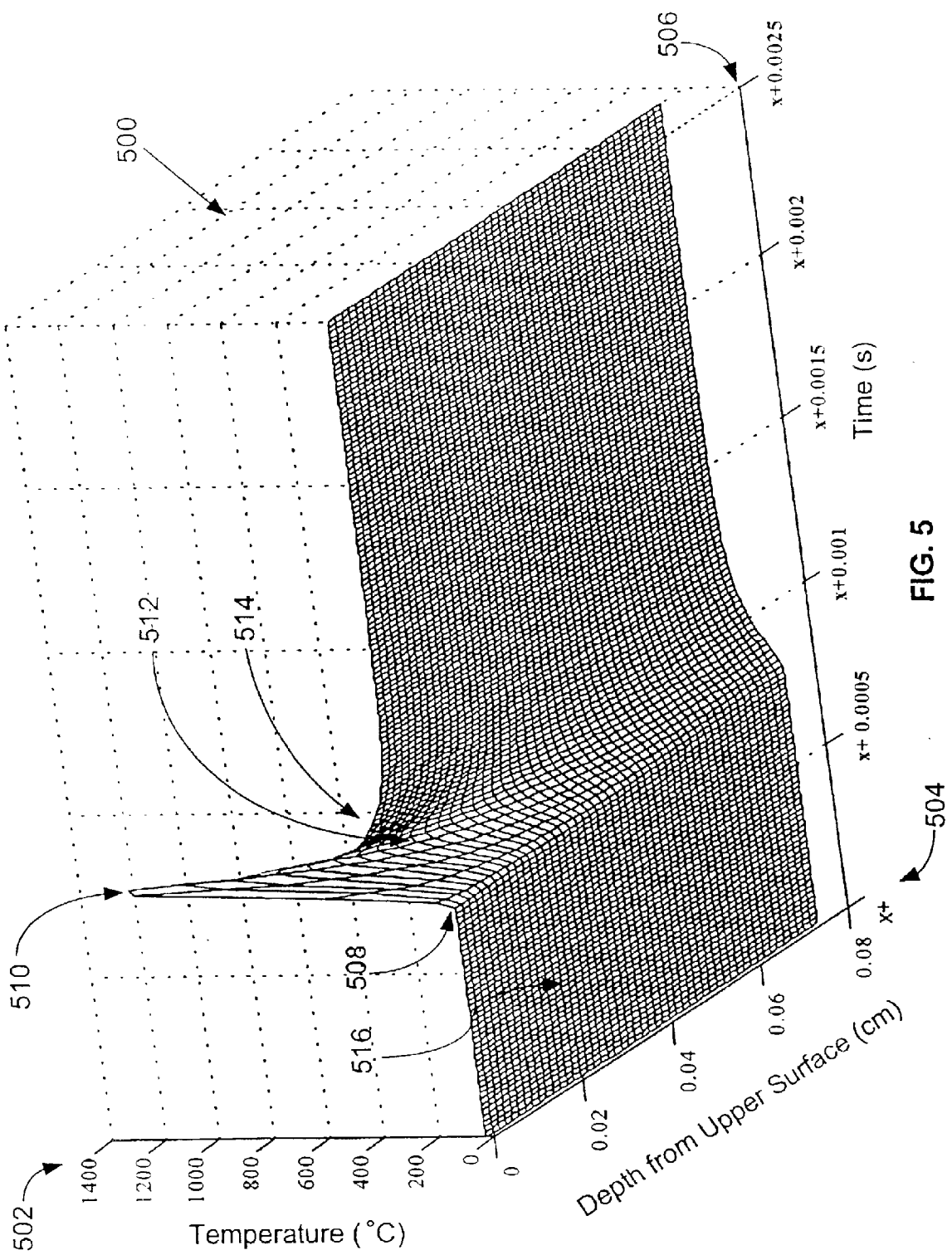
FIG. 5 is a graph of the temperature at a fixed point on and through the substrate during thermal processing, according to an embodiment of the invention.

FIG. 5 is a graph 500 of the temperature versus time and depth at a fixed point on and through the substrate during thermal processing performed according to the method described above in relation to FIG. 4. A temperature axis 502 indicates a temperature of between 0 and 1400° C. at the fixed point. Axis 504 indicates a depth from the upper surface 224 (FIG. 2B) into the substrate 214 (FIG. 2B) at the fixed point. Axis 506 indicates the time in seconds at some point after the start of scanning. The fixed point is assumed to be located at 508.

As the line of radiation 222 (FIG. 2B) scans across the upper surface 224 (FIG. 2B) of the substrate 214 (FIG. 2B) it subjects a line or chord on the substrate to the heat it generates. Before the line of radiation reaches the fixed point, the temperature at the fixed point, both at the upper surface and throughout a substrate cross-section at the fixed point, is ambient temperature, as indicated by reference numeral 516. As soon as the line of radiation reaches the fixed point at 508, the temperature at the upper surface ramps up to 1200° C. (or other desired temperature necessary for the process) almost instantaneously, as shown by reference numeral 510. At the same time, the substrate acts as a heat sink resulting in a dramatic drop-off in temperature away from the surface, as indicated by reference numeral 512. For example, as shown in FIG. 5, at 0.04 cm from the point on the upper surface the temperature is approximately 200° C. Thus, the heating effect is generally localized to the upper surface only. This is extremely advantageous, as generally only the regions near the upper surface 224 (FIG. 2A) of the substrate require thermal processing.

As the line of radiation passes over and away from the fixed point, the temperature drops rapidly, as shown at reference numeral 514. Again this is because the substrate acts as a heat sink diffusing the heat at the upper surface throughout the remainder of the cooler substrate. This is not possible with prior art thermal systems, such as RTP, that simultaneously heat the entire substrate, as the entire substrate is at an elevated temperature and, therefore, cannot easily dissipate the heat to a cooler region. In fact, no comparison can be made to RTP on the time scale shown in FIG. 5, as a superimposed RTP graph would yield an almost flat plane at 1100° C. extending for about one second. One second is nearly three orders of magnitude greater than the time period illustrated in FIG. 5.

This transfer of heat to the bulk of the substrate assists homogenous thermal exposure, as heat has enough time to diffuse from a locally strong absorbing device region to a lower absorbing device region. Also, pattern density effects are comparable to RTP. However, the time scale is short enough to limit the diffusion depth of the heat transfer to several microns, as opposed to the several hundred-micron thickness of a substrate, as is the case with RTP, thereby greatly reducing the total required power. The bulk of the substrate is not appreciably heated, thereby providing an ideal heat sink for the temperature ramp down.

One concern of prior art laser annealing systems, regards stress related defects caused by rapidly heating relatively small areas of a substrate. Therefore, experimentation was undertaken to test whether the thermal flux processing of the present invention causes any stress related defects in the substrate. Peak stress occurs near the max temperature gradient, not the max temperature. If a line of radiation is suitably narrow and the depth of heating suitably shallow, it is possible to displace the region of maximum thermal gradient from the region of highest temperature, thereby increasing the slip window and decreasing defects. During this experimentation, a sample was scanned at 20 cm/s under a 400 microns wide line of radiation with a peak power density of 60 kW/cm$^2$. The present invention was able to displace the peak thermal gradient from the peak temperature, thus enabling Ultra Shallow Junction (USJ) formation suitable for the 70 nm node with a 1 keV Boron implant without introducing any dislocations. Only the typical implant related defects were observed.

In another embodiment, the line of continuous wave electromagnetic radiation does not extend across the entire width of the substrate. Rather, the line extends across the partial width of the substrate. In this embodiment, the line of continuous wave electromagnetic radiation may make more than one scans across the substrate surface.

Figure 6:
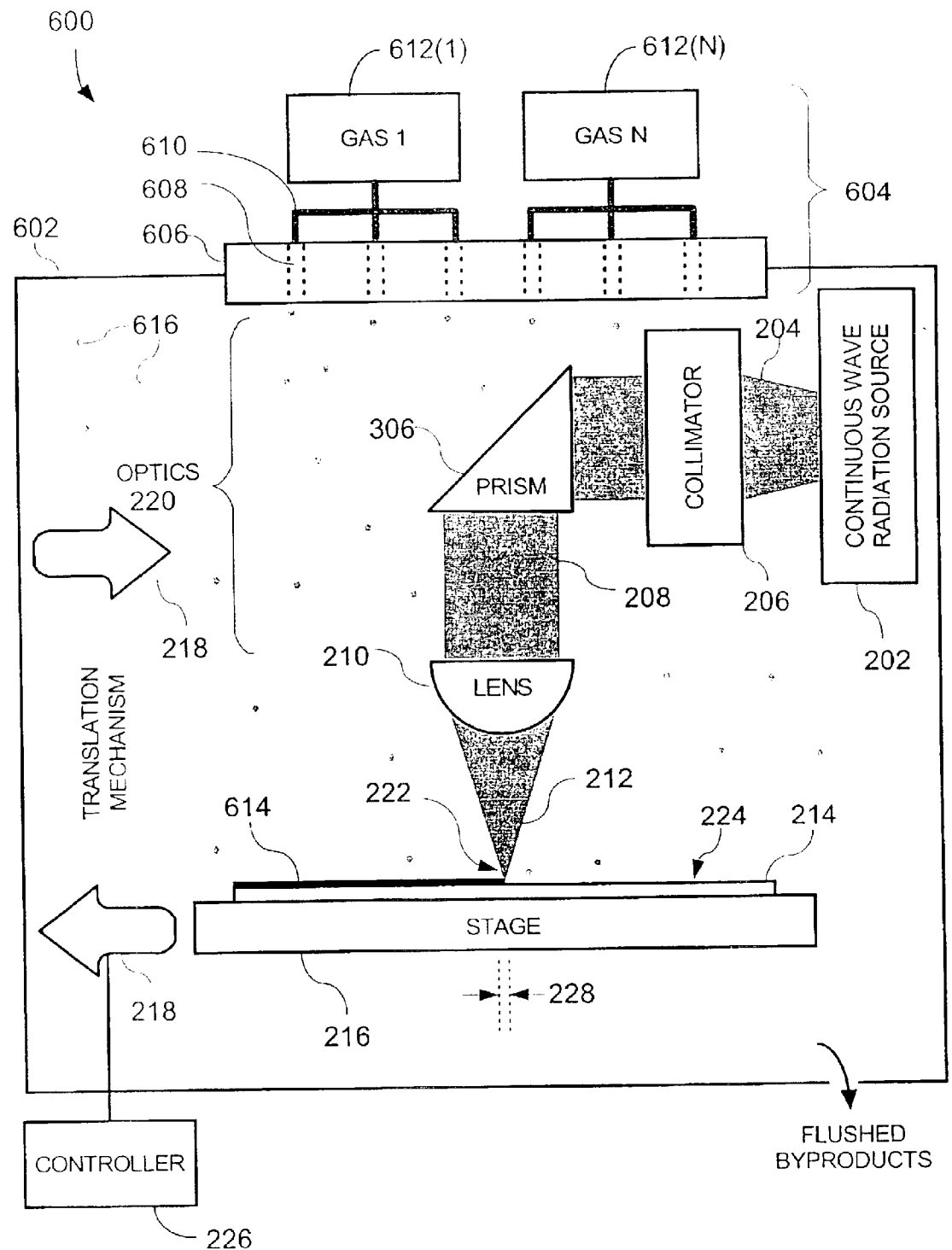
FIG. 6 is a side view of an apparatus for depositing layers on a substrate, according to another embodiment of the invention.

FIG. 6 is a side view of an apparatus 600 for depositing layers on a substrate, according to another embodiment of the invention. The apparatus 600 is similar to the apparatus 200 shown in FIGS. 2A and 2B, and apparatus 300 shown in FIG. 3. Components having the same reference numerals are the same as those shown in FIGS. 2A and 2B. In addition, the apparatus 600 my be used to perform deposition processes, such as CVD, ALD, or the like.

In addition to the components described above in relation to FIGS. 2A and 2B, apparatus 600 shows a reaction chamber 602 in which many of the components are housed. At least one injector 604 is used to introduce or inject one or more gases into the reaction chamber 602. The gas injector 604 preferably comprises one or more gas sources 612(1)–(N) fluidly coupled 610 to one or more gas inlets 608 in a gas manifold 606. The gas injector 604 may be located at any suitable location within the reaction chamber 602. For example, gas may be injected at the side of the reaction chamber and flow across the surface of the substrate orthogonally to the direction of relative motion between the line of radiation and the surface of the substrate.

In the embodiment shown in FIG. 6, continuous wave electromagnetic radiation is collimated by the collimator, redirected towards the substrate by the prism 306 and focused into a line by the lens 210. It should, however, be appreciated that the optics 220 may comprise any suitable optics capable of focusing a line of energy onto the upper surface 224 of the substrate 214, as described above. Further, it should be appreciated that the optics may be placed outside of the chamber, where radiation passes into the chamber via a transparent window. Still further, the chamber and/or gas sources may take on any suitable shape and/or configuration.

Figure 7:
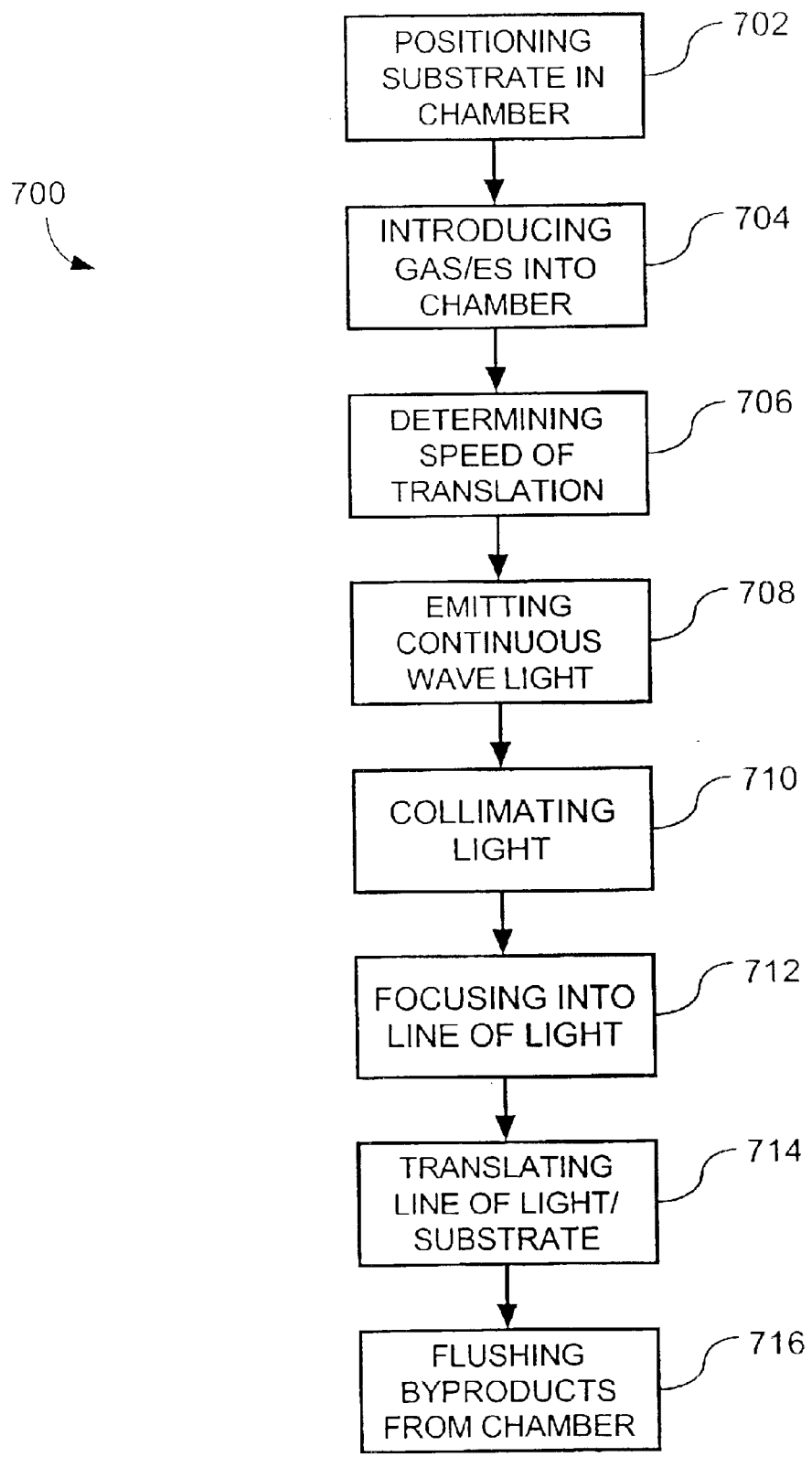
FIG. 7 is a flow chart of a method for depositing layers on a substrate, according to the embodiment of the invention shown in FIG. 6.

FIG. 7 is a flow chart 700 of a method for depositing one or more layers on a substrate, according to the embodiment of the invention shown in FIG. 6. A substrate 214 (FIG. 6) is positioned in the reaction chamber 602 (FIG. 6), at 702. One or more gases 616 (FIG. 6), such as ammonia (NH$_3$) and dichlorosilane (DCS), containing the atoms or molecules required in layer 614 (FIG. 6) are then introduced at 704 into the reaction chamber 602 (FIG. 6) containing the substrate 214 (FIG. 6).

A predetermined speed for translating a line of radiation 222 (FIG. 6), as described below, is determined at 706. This predetermined speed is based on a number of factors, such as a thermal recipe for processing the substrate, the properties of the substrate, a power of the continuous wave electromagnetic radiation, a width of the line of radiation, a power density at the line of radiation, or the like. In a preferred embodiment, this predetermined speed is approximately 2 cm/s.

Continuous wave electromagnetic radiation is then emitted at 708 from a continuous wave electromagnetic radiation source 202 (FIG. 6), as described above. The continuous wave electromagnetic radiation is preferably collimated at 710 by the collimator 206 (FIG. 6).

The continuous wave electromagnetic radiation is subsequently focused at 712 at into a line of radiation 222 (FIG. 6) extending across the upper surface 224 (FIG. 6) of the substrate. In a preferred embodiment, the width 228 (FIG. 6) of the line of radiation is approximately 35 microns wide. The line of radiation is then translated at 714 relative to the surface at the constant predetermined speed, determined above. This translation is undertaken by the translation mechanism 218 (FIG. 6) under control of the controller 226 (FIG. 6).

The combination of the introduced gas/es and heat generated by the line of radiation causes the at least one gas 616 (FIG. 6) to react and deposit a layer 614 (FIG. 6) on the surface of the substrate. This reaction may be a chemical reaction between gases, a decomposition of one or more gases, or the like. Undesirable byproducts of the reaction are then flushed from the reaction chamber at 716.

This process is repeated until a layer 614 (FIG. 6) having a predetermined thickness is formed on the upper surface 224 (FIG. 6) of the substrate 214 (FIG. 6). The predetermined scan speed is preferably faster than that required for thermal flux annealing, described above, as, multiple scans are required to build a film/layer. Typically, each deposited layer is between 8–10 angstroms. Required films/layers vary from 20 angstroms for tunnel oxide used in flash memory to 1500 angstroms for spacer applications. Therefore, the preferred scan speed is generally in the range of a few cm/sec to about 1 m/sec. The preferred line width 228 (FIG. 6) is the same as that described above.

The chemical reaction is controlled by controlling: the temperature of the substrate surface by adjusting the continuous wave electromagnetic radiation or the line of radiation; the amount and/or ratio of the gas/es introduced into the reaction chamber; and the pressure within the reaction chamber.

The above described method can heat the substrate surface to any temperature for a millisecond or less. In addition, as the gas right near the surface is heated by the line of radiation, the reaction of the gasses only occurs at or near the surface. The heating is very brief as the line keeps moving so only the gas right near the surface gets to react. Because gas away from the surface never gets hot, undesirable gas phase reactions are prevented. This allows, multiple gasses to be injected simultaneously without leading to undesirable gas phase reactions away from the substrate surface.

Figure 8:
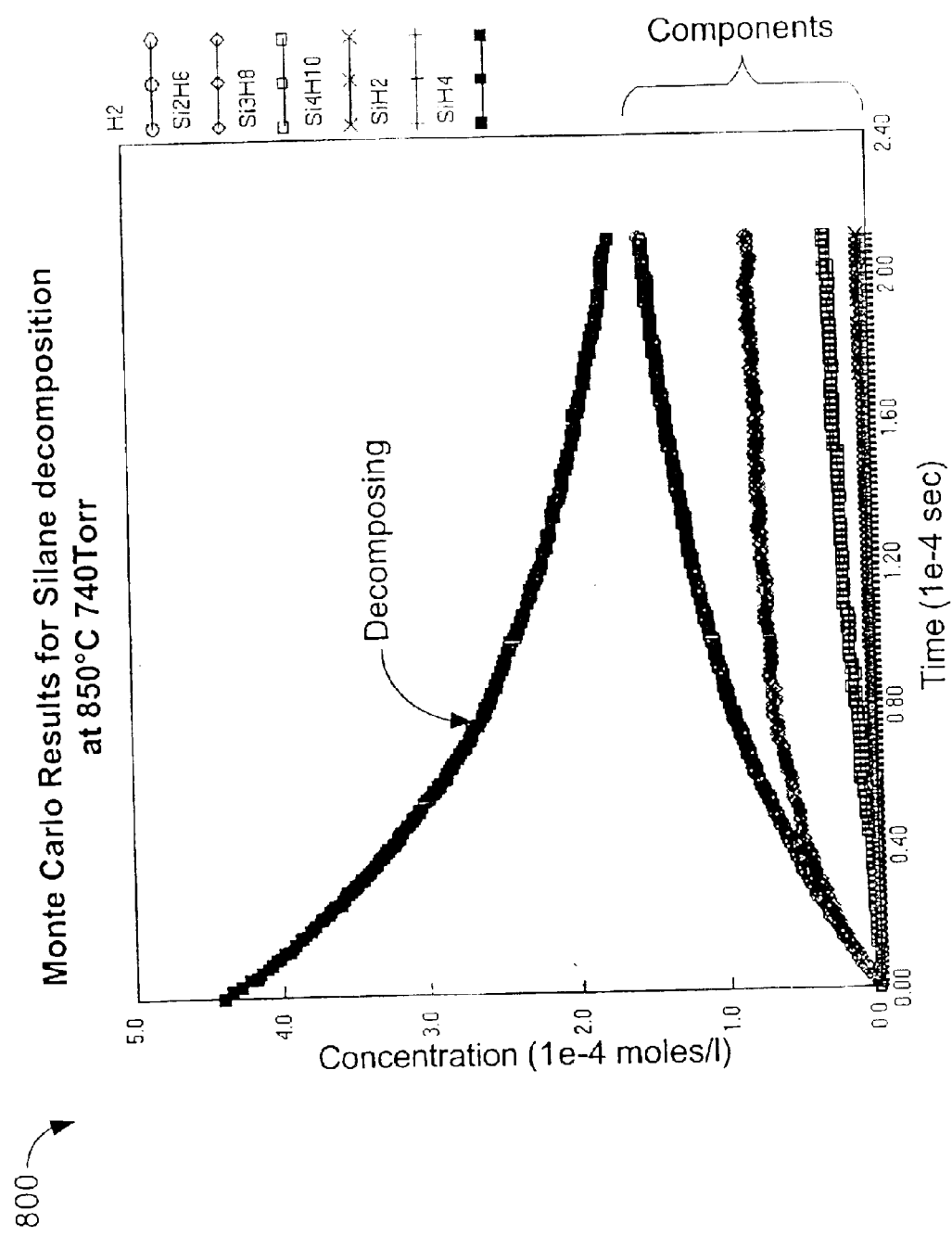
FIG. 8 is a graph of the results of a Monte Carlo simulation for Silane decomposition at 850° C. and 740 Torr, according to the embodiment of the invention shown in FIG. 6.

In a preferred embodiment, the above described method is performed at a pressure of between a few Torr to pressures above atmospheric pressure, with atmospheric pressure being preferred. FIG. 8 shows the results of a simulation showing that sufficient decomposition of reactants can occur at such pressures on this short time scale. Also in a preferred embodiment, the temperature of the line of radiation depends on the film/layer being deposited, but is generally in the range of 600 to 900° C.

FIG. 8 is a graph 800 of the results of a Monte Carlo simulation for Silane decomposition at 850° C. and 740 Torr, according to the embodiment of the invention shown in FIG. 6. This simulation at lower pressures duplicates a deterministic model published by Meyerson, Scott and Tsui, Chemtronics 1 (1986) 150, which is hereby incorporated by reference.

This graph 800 shows that a Silane, such as dichlorosilane (DCS), which is a typical CVD gas, decomposes into molecules required for deposition onto the substrate surface. Decomposition occurs at 740 Torr, which is approximately atmospheric pressure, and at a temperature of 850° C. The overall time in which decomposition occurs at this temperature and pressure is approximately $6 \times 10^{-4}$ seconds per pass. This temperature and scan speed can only be provided by the present invention, as prior art methods cannot achieve such a high temperature in such a short amount of time, while providing enough time for reactions to occur.

The above described apparatus and method for depositing a layer on a substrate has a number of advantages. For example, the thermal budget of the process is low due to the brief time spent at elevated temperature.

In addition, as the line of radiation only applies heat to the surface of the substrate, the reaction of the gasses only occurs at the surface. This leads to a reduction in gas phase transport limitations. This also leads to a reduction in gas phase reactions away from the surface, thereby avoiding undesirable particle formation on the substrate surface. In addition, this method can be performed at atmospheric pressure, resulting in faster decomposition of reactants, such as Silane, thereby enabling high deposition rates.

The foregoing descriptions of specific embodiments of the present invention are presented for purposes of illustration and description. They are not intended to be exhaustive or to limit the invention to the precise forms disclosed. Obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents. In addition, any references cited above are incorporated herein by reference.

What is claimed is:

1. An apparatus for forming a layer on a substrate, comprising:

a reaction chamber;

at least two gas injectors connectable through respective respective coupling lines to respective gas sources and configured to inject at least two respective gases into said reaction chamber;

a continuous wave electromagnetic radiation source;

a stage within said reaction chamber, said stage configured to receive a substrate thereon;

optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and a translation mechanism configured to translate said stage and the line of continuous wave electromagnetic radiation relative to one another.

2. The apparatus of claim 1, wherein said line of continuous wave electromagnetic radiation extends entirely across a width of the substrate.

3. An apparatus for forming a layer on a substrate, comprising
a reaction chamber;
a gas injector configured to inject at least one gas into said reaction chamber;
a continuous wave electromagnetic radiation source;
a stage within said reaction chamber, said state configured to receive a substrate thereon;
optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate, wherein said line of continuous wave electromagnetic radiation source is at least one laser; and
a translation mechanism configured to translate said stage and the line of continuous wave electromagnetic radiation relative to one another.

4. The apparatus of claim 3, wherein said continuous wave electromagnetic radiation source is at least one laser diode.

5. The apparatus of claim 1, wherein said continuous wave electromagnetic radiation source has a power between 0.5 kW and 50 kW.

6. The apparatus of claim 1, wherein said continuous wave electromagnetic radiation source has a power of approximately 5 kW.

7. An apparatus for forming a layer on a substrate, comprising:
a reaction chamber;
a gas injector configured to inject at least one gas into said reaction chamber;
a continuous wave electromagnetic radiation source, wherein the line of radiation has a power density of between 10 kW/cm$^2$ and 200 kW/cm$^2$;
a state within said reaction chamber, said state configured to receive a substrate thereon;
optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and
a translation mechanism configured to translate said stage and the line of continuous wave electromagnetic radiation relative to one another.

8. The apparatus of claim 1, wherein said stage includes a means for securely grasping said substrate.

9. An apparatus for forming a layer on a substrate, comprising:
a reaction chamber;
a gas injector configured to inject at least one gas into said reaction chamber;
a continuous wave electromagnetic radiation source;
a stage within said reaction chamber, said stage configured to receive a substrate thereon;
optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate, wherein said optics comprise at least one collimator and at least one lens configured to focus continuous wave electromagnetic radiation from said continuous wave electromagnetic radiation source into the line of continuous wave electromagnetic radiation at the upper surface of the substrate; and
a translation mechanism configured to translate said stage and the line of continuous wave electromagnetic radiation relative to one another.

10. The apparatus of claim 1, wherein said optics comprise at least one cylindrical lens configured to focus continuous wave electromagnetic radiation from said continuous wave electromagnetic radiation source into the line of continuous wave electromagnetic radiation at the upper surface of the substrate.

11. The apparatus of claim 1, wherein said optics are selected from a group consisting of at least one:
cylindrical lens, collimator, optical fiber, waveguide, diffuser, diffractive lens, Fresnel lens, concave lens, convex lens, plane mirror, convex mirror, refractive lens, gradient index lens, and any combination of the aforementioned.

12. The apparatus of claim 1, further comprising a controller to control a speed of said translation mechanism.

13. The apparatus of claim 1, wherein said translation mechanism moves said stage and the line of continuous wave electromagnetic radiation relative to one another at constant speed.

14. An apparatus for forming a layer on a substrate, comprising:
a reaction chamber;
a gas injector configured to inject at least one gas into said reaction chamber;
a continuous wave electromagnetic radiation source;
a stage within said reaction chamber, said stage configured to receive a substrate thereon;
optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and
a translation mechanism configured to translate said stage and the line of continuous wave electromagnetic radiation relative to one another, wherein said translation mechanism is coupled to said stage.

15. An apparatus for forming a layer on a substrate, comprising:
a reaction chamber;
a gas injector configured to inject at least one gas into said reaction chamber;

a continuous wave electromagnetic radiation source;

a stage within said reaction chamber, said stage configured to receive a substrate thereon;

optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and a translation mechanism configured to translate said stage and the line of continuous wave electromagnetic radiation relative to one another, wherein said translation mechanism is coupled to said optics.

16. An apparatus for forming a layer on a substrate, comprising:

a reaction chamber;

a gas injector configured to inject at least one gas into said reaction chamber;

a continuous wave electromagnetic radiation source;

a stage within said reaction chamber, said stage configured to receive a substrate thereon;

optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and a translation mechanism configured to translate said state and the line of continuous wave electromagnetic radiation relative to one another, wherein said translation mechanism is coupled to said optics and said continuous wave electromagnetic radiation source.

17. The apparatus of claim 1, wherein said translation mechanism moves said stage and the line of continuous wave electromagnetic radiation relative to one another in a direction substantially perpendicular to said line of radiation.

18. The apparatus claim 1, wherein said substrate is selected from a group consisting of: a single crystal silicon substrate, silicon on insulator (SOI), Silicon Germanium, alloys of Silicon Germanium, glass, and quartz.

19. An apparatus for forming a layer on a substrate, comprising:

a reaction chamber;

a gas injector configured to inject at least one gas into said reaction chamber;

a continuous wave electromagnetic radiation source;

a stage within said reaction chamber, said state configured to receive a substrate thereon;

optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate, wherein the line of radiation has width of approximately 3 to 500 microns wide.

20. An apparatus for forming a layer on a substrate, comprising:

a reaction chamber;

a gas injector configured to inject at least one gas into said reaction chamber;

a continuous wave electromagnetic radiation source;

a stage within said reaction chamber, said stage configured to receive a substrate thereon;

optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and a translation mechanism confirmed to translate said stage and the line of continuous wave electromagnetic radiation relative to one another;

wherein said apparatus has a temperature ramp-up rate of larger than $1 \times 10^{6}$ C./s.

21. An apparatus for forming a layer on a substrate, comprising;

a reaction chamber;

a gas injector configured to inject at least one gas into said reaction chamber;

a continuous wave electromagnetic radiation source;

a stage within said reaction chamber, said stage configured to receive a substrate thereon;

optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and a translation mechanism configured to translate said stage and the line of continuous wave electromagnetic radiation relative to one another;

wherein said apparatus has a temperature ramp-down rate of larger than $1 \times 10^{6}$ C./s.

22. The apparatus of claim 1, wherein continuous wave electromagnetic radiation from said continuous electromagnetic radiation source has a wavelength between 190 nm and 950 nm.

23. A method for forming a layer on a substrate, comprising:

positioning a substrate into a reaction chamber;

introducing at least one gas into said reaction chamber;

focusing continuous wave electromagnetic radiation into a line of radiation extending at least partially across a surface of the substrate;

translating said line of radiation relative to said surface at a constant predetermined speed, such that a combination of the least one gas and heat generated by the line of radiation causes the least one gas to react and form a layer on the surface of the substrate.

24. The method of claim 23, comprising, prior to said focusing, determining said constant predetermined speed based on factors selected from a group consisting of:

a thermal recipe for processing said substrate, properties of said substrate, a power of said continuous wave electromagnetic radiation, a width of said line of radiation, a power density at said line of radiation, and any combination of the aforementioned.

25. The method of claim 23, comprising, prior to said focusing, emitting said continuous wave electromagnetic radiation from one or more laser diodes.

26. The method of claim 23, comprising, prior to said focusing, emitting said continuous wave electromagnetic radiation, where said continuous wave electromagnetic radiation, where said continuous wave electromagnetic radiation is uniform and coherent radiation having a single wavelength.

27. The method of claim 23, comprising, prior to said focusing emitting said continuous wave electromagnetic radiation, where said continuous wave electromagnetic radiation is not pulsed or flashed.

28. The method of claim 23, comprising, prior to said focusing collimating said continuous wave electromagnetic radiation.

29. The method of claim 23, further comprising repeating said introducing, focusing, and translating to build a layer having a predetermined thickness.

30. The method of claim 23, further comprising controlling a temperature of said continuous wave electromagnetic radiation.

31. The method of claim 23, further comprising controlling an amount of said at least one gas introduced into said reaction chamber.

32. The method of claim 23, further comprising controlling a pressure within said reaction chamber.

33. The method of claim 23, wherein said introducing comprises injecting multiple gases into said reaction chamber.

34. The method of claim 23, further comprising controlling a ratio of said multiple gases introduced into said reaction chamber.

35. The method of claim 23, wherein said layer is deposited on said substrate.

36. The method of claim 23, wherein said line extends entirely across said substrate.

37. A method for depositing a layer on a substrate, comprising positioning a substrate in a reaction chamber and a sequence of steps of:
introducing at least one gas into said reaction chamber;
focusing continuous wave electromagnetic radiation into a line of radiation extending at least partially across a surface of the substrate;
translating said line of radiation relative to said surface at a predetermined speed such that a combination of the at least one gas and heat generated by the line of radiation causes the at least one gas to react and deposit a first layer on the surface of the substrate, said first layer having a thickness of no more than 1 nm.

38. The method of claim 37, further comprising flushing said reaction chamber after said first layer has been deposited.

39. The method of claim 37, comprising a plurality of sequentially performed sequences of said steps to deposit a plurality of said first layers on said substrate.

40. The method of claim 39, wherein each of said sequences further comprises flushing said reaction chamber after said first layer has been deposited.

41. The method of claim 37, wherein said continuous wave electromagnetic radiation is produced by at least one laser.

42. A method for depositing a layer on a substrate, comprising positioning a substrate in a reaction chamber and a plurality of sequentially performed sequences of steps each comprising:
introducing at least one gas into said reaction chamber;
focusing continuous wave electromagnetic radiation into a line of radiation extending across a surface of the substrate; and
translating said line of radiation relative to said surface at a predetermined speed such that a combination of the at least one gas and heat generated by the line of radiation causes the at least one gas to react and deposit a first layer on the surface of the substrate;
wherein said plurality of sequences deposits a plurality of first layers on the surface of the substrate.

43. The method of claim 42, wherein each of said first layers has a thickness of no more than 1 nm.

44. The apparatus of claim 1, wherein at least one of said at least two gases and said continuous wave electromagnetic radiation effect chemical vapor deposition of said layer onto said substrate.

45. The apparatus of claim 3, wherein said line extends entirely across said substrate.

46. The apparatus of claim 3, wherein at least one of said at least one gas and said continuous wave electromagnetic radiation effect chemical vapor deposition of said layer onto said substrate.

47. The apparatus of claim 7, wherein said line extends entirely across said substrate.

48. The apparatus of claim 7, wherein at least one of said at least one gas and said continuous wave electromagnetic radiation effect chemical vapor deposition of said layer onto said substrate.

49. The apparatus of claim 9, wherein said line extends entirely across said substrate.

50. The apparatus of claim 9, wherein at least one of said at least one gas and said continuous wave electromagnetic radiation effect chemical vapor deposition of said layer onto said substrate.

51. The apparatus of claim 14, wherein the line of continuous wave electromagnetic radiation extends entirely across the substrate.

52. The apparatus of claim 14, wherein at least one of said at least one gas and said continuous wave electromagnetic radiation effect chemical vapor deposition of said layer onto said substrate.

53. The apparatus of claim 15, wherein the line of continuous wave electromagnetic radiation extends entirely across the substrate.

54. The apparatus of claim 15, wherein at least one of said at least one gas and said continuous wave electromagnetic radiation effect chemical vapor deposition of said layer onto said substrate.

55. The apparatus of claim 16, wherein the line of continuous wave electromagnetic radiation extends entirely across the substrate.

56. The apparatus of claim 16, wherein at least one of said at least one gas and said continuous wave electromagnetic radiation effect chemical vapor deposition of said layer onto said substrate.

57. The apparatus of claim 19, wherein the line of continuous wave electromagnetic radiation extends entirely across the substrate.

58. The apparatus of claim 14, wherein at least one of said at least one gas and said continuous wave electromagnetic radiation effect chemical vapor deposition of said layer onto said substrate.

59. The apparatus of claim 20, wherein the line of continuous wave electromagnetic radiation extends entirely across the substrate.

60. The apparatus of claim 20, wherein at least one of said at least one gas and said continuous wave electromagnetic radiation effect chemical vapor deposition of said layer onto said substrate.

61. The apparatus of claim 21, wherein the line of continuous wave electromagnetic radiation extends entirely across the substrate.

62. The apparatus of claim 21, wherein said at least one gas and said continuous wave electromagnetic radiation effect chemical vapor deposition of said layer onto said substrate.

* * * * *